United States Patent
Takeuchi et al.

(10) Patent No.: US 7,268,636 B2
(45) Date of Patent: Sep. 11, 2007

(54) VOLTAGE CONTROLLED OSCILLATOR

(75) Inventors: Hisato Takeuchi, Yokohama (JP); Keigo Shingu, Suginami-ku (JP); Takashi Ootsuka, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 7 days.

(21) Appl. No.: 11/181,129

(22) Filed: Jul. 14, 2005

(65) Prior Publication Data

US 2006/0012445 A1    Jan. 19, 2006

(30) Foreign Application Priority Data

Jul. 14, 2004   (JP)   ............... 2004-207098

(51) Int. Cl.
*H03B 5/36* (2006.01)
(52) U.S. Cl. ................... 331/158; 331/116 FE
(58) Field of Classification Search ........ 331/158, 331/116 FE
See application file for complete search history.

(56) References Cited

U.S. PATENT DOCUMENTS

| | | | |
|---|---|---|---|
| 4,302,731 A * | 11/1981 | Ashida | 331/116 R |
| 5,764,112 A | 6/1998 | Bal et al. | |
| 6,559,730 B1 | 5/2003 | Marvin et al. | |
| 6,628,175 B1 | 9/2003 | Guo et al. | |
| 2005/0225405 A1 | 10/2005 | Tateyama | |
| 2006/0017517 A1 | 1/2006 | Ootsuka et al. | |

FOREIGN PATENT DOCUMENTS

| | | |
|---|---|---|
| JP | 4-320102 | 11/1992 |
| JP | 05-2435 | 1/1993 |
| JP | 9-102714 | 4/1997 |
| JP | 10-51238 | 2/1998 |
| JP | 11-220329 | 8/1999 |
| JP | 2000-31741 | 1/2003 |
| JP | 2003-46334 | 2/2003 |
| JP | 2003-282723 | 10/2003 |
| JP | 2003-318417 | 11/2003 |
| WO | WO 2004/079895 | 9/2004 |

OTHER PUBLICATIONS

International Search Report for Application No. PCT/JP2004/002635 dated Jun. 15, 2004.

* cited by examiner

*Primary Examiner*—Joseph Chang
(74) *Attorney, Agent, or Firm*—RatnerPrestia

(57) ABSTRACT

In a voltage controlled oscillator including an amplifier, a feedback circuit and a crystal oscillator, two MOS transistors M1, M2 are connected for use as variable capacity elements for the frequency adjustment of the voltage controlled oscillator. Drains of the MOS transistors M1, M2 are respectively connected to an XT terminal and an XTB terminal of the crystal oscillator. Sources of the MOS transistors M1, M2 are made common and connected to a grounding terminal via a capacitor C3. Gates of the MOS transistors M1, M2 are made common, and an added voltage signal of a temperature compensating signal voltage and an external frequency control signal voltage is applied to the common gate terminals of the MOS transistors to thereby perform the frequency control of the oscillator.

2 Claims, 13 Drawing Sheets

VOLTAGE CONTROLLED OSCILLATOR

BACKGROUND OF THE INVENTION

1. Field of the Invention

The present invention relates to a voltage controlled oscillator using a variable capacitor.

2. Description of Related Art

As conventional voltage controlled oscillators, there is one type using a varactor diode and another type using a resistance value switched by switching of an MOS transistor.

According to conventional techniques described in Japanese Unexamined Patent Laid-open Publication No. H09-102714 (1997) (referred to as "Patent document 1") and U.S. Pat. No. 5,764,112 (referred to as "Patent document 2"), an ON resistance of a MOS transistor connected to a fixed capacitor in series is switched by switching the ON resistance of the MOS transistor, and thereby a load capacitor seen from an oscillator is changed, so that the frequency is varied.

In formation with a bias voltage set to a gate and a drain connected to a crystal oscillator, when a drain voltage is below a threshold voltage than a gate voltage which represents an ON state of the MOS transistor, a capacitance of a source side appears visible. The voltage controlled oscillator may be constituted as TCXO by applying a temperature compensating voltage or the like to the gate.

FIG. 14 shows a first configuration example of a conventional voltage controlled oscillator, FIG. 15 shows an operation of a conventional circuit, and FIG. 16 shows a second configuration example of a conventional voltage controlled oscillator.

In the first configuration example shown in FIG. 14, an amplifier 1 and a feedback circuit 2 are connected to connection terminals XT, XTB of a crystal oscillator 3 in parallel. Drains of a pair of first and second MOS transistors M1, M2 are connected to the connection terminals XT, XTB of the crystal oscillator 3, and capacitors C1, C2 of fixed capacitance are connected between source terminals thereof and a GND terminal, respectively. The gate terminals of the MOS transistors M1, M2 are connected to each other, and are used as application terminals of a control voltage.

In the switching operation of the MOS transistor M1 shown in FIG. 15, a voltage waveform of a drain terminal of the MOS transistor M1 has an AC amplitude by using the crystal oscillator 3. Then, when the gate voltage of the MOS transistor M1 is set to, for example, 3V as a control signal, and the amplitude of the drain voltage falls by a threshold voltage VT of the MOS transistor from the gate voltage (in this case VT=1V in FIG. 15), a time domain of 2V or less becomes the ON time of the MOS transistor M1. The ON resistance of the MOS transistor M1 becomes extremely low at this ON time, and the capacitance between the source and a GND works greatly as the load capacitor of the crystal oscillator 3, and the control operation acts to lower the frequency.

Herein, a capacitance value is virtually changed according to a ratio of the ON-OFF switching times of the MOS transistor M1, and the frequency can be controlled. Since the drain voltage of the MOS transistor M2 has also a large amplitude, the MOS transistor M2 performs the same operation.

In FIG. 15, when the control voltage shown in FIG. 14 is divided into two kinds to control the frequency of the oscillator, the sizes of the MOS transistors M1, M2 are divided into ½ sizes and the gates thereof are connected to each other. Thereby, an input terminal having the same control sensitivity can be made. In this arrangement, the division of two or more may be performed.

As a result, the control voltages of a temperature compensating signal and an external frequency control signal (VCO) can be separately inputted to perform the control.

Meanwhile, in the second conventional example shown in FIG. 16, a different point from the configuration shown in FIG. 14 resides in that, drains of four MOS transistors M1, M3 and M2, M4 are respectively connected to two connection terminals (XT, XTB) of the crystal oscillator 3, and the sources of the MOS transistors M1 and M3 are made common and connected to the grounding terminal via the capacitor C1 while the sources of the MOS transistors M2 and M4 are made common and connected to the grounding terminal via the capacitor C2. Since the other components of the second conventional example are the same as those of the first conventional example shown in FIG. 14, the explanation of the operation of the second example is omitted here.

In the conventional example shown in FIG. 14, however, it is necessary to lay out the fixed capacitances in the source sides of the MOS transistors respectively, and it is disadvantageous in view of a chip area or the like. Also, the VT variations of the MOS transistor easily affected in the conventional example, and it is very difficult to match the characteristics to be expected.

SUMMARY OF THE INVENTION

It is an object of the present invention to solve the problem and to provide a voltage controlled oscillator realizing a simplified circuit.

To attain the above object, according to a first aspect of the present invention, a voltage controlled oscillator has an amplifier, a feedback circuit and a crystal oscillator, the feedback circuit and the crystal oscillator connected in parallel across an input side terminal and an output side terminal of the amplifier. The voltage controlled oscillator comprises: a pair of first and second MOS transistors (M1, M2) serving as variable capacitance elements for frequency adjustment. Drains of the first and second MOS transistors are respectively connected to two terminals (XT, XTB) of the crystal oscillator; sources of the first and second MOS transistors are made common by connecting to each other; and gates of the first and second MOS transistors are made common by connecting to each other, In this configuration, an added voltage signal of a temperature compensating signal voltage and an external frequency control signal voltage is applied to the common gate terminals of the first and second MOS transistors to thereby perform the frequency control of the oscillator.

According to a second aspect of the present invention, the common sources of the first and second MOS transistors may be connected to a grounding terminal via a capacitor (C3) in the configuration of the first aspect.

According to a third aspect of the present invention, a voltage controlled oscillator has an amplifier, a feedback circuit and a crystal oscillator, the feedback circuit and the crystal oscillator connected in parallel across an input side terminal and an output side terminal of the amplifier. The voltage controlled oscillator comprises a pair of first and second MOS transistors (M1, M2) serving as variable capacitance elements for frequency adjustment. Drains of the first and second MOS transistors are connected to two terminals (XT, XTB) of the crystal oscillator via first and second capacitors (C4, C5), respectively; sources of the first and second MOS transistors are made common by connecting to each other; and gates of the first and second MOS transistors are made common by connecting to each other.

In this configuration, one of the drains and the common gate terminals of the first and second MOS transistors is supplied with a temperature compensating signal voltage and the other thereof is supplied with an external frequency control signal voltage to thereby perform the frequency control of the oscillator.

According to a fourth aspect of the present invention, the common sources of the first and second MOS transistors may be connected to a grounding terminal via a capacitor (C3) in the configuration of the third aspect.

According to a fifth aspect of the present invention, a voltage controlled oscillator has an amplifier, a feedback circuit and a crystal oscillator, the feedback circuit and the crystal oscillator connected in parallel across an input side terminal and an output side terminal of the amplifier. The voltage controlled oscillator comprises a plurality of MOS transistors (M1,M2, M3,M4) serving as variable capacitance elements for frequency adjustment. Drains of first and second pairs of the MOS transistors (M1,M3; M2,M4) are respectively connected to two terminals (XT, XTB) of the crystal oscillator; sources of the plurality of the MOS transistors are made common by connecting to each other; and gates of the first pair of the MOS transistors (M1, M3) connected to the input side of the amplifier and gates of the second pair of the MOS transistors (M4, M2) connected to the output side of the amplifier are respectively made common.

In this configuration, a plurality of frequency control signal voltages are applied to the plural pairs of the common gate terminals of the plurality of the MOS transistors to thereby perform the frequency control of the oscillator.

According to a sixth aspect of the present invention, the common sources of the plurality of the MOS transistors may be connected to a grounding terminal via a capacitor (C3) in the configuration of the fifth aspect.

According to a seventh aspect of the present invention, a voltage controlled oscillator has an amplifier, a feedback circuit and a crystal oscillator, the feedback circuit and the crystal oscillator connected in parallel across an input side terminal and an output side terminal of the amplifier. The voltage controlled oscillator comprises a plurality of MOS transistors (M1, M2, M3, M4) serving as variable capacitance elements for frequency adjustment. Drains of first and second pairs of the MOS transistors (M1,M3; M2,M4) are connected to two terminals (XT, XTB) of the crystal oscillator via first and second capacitors (C4, C5), respectively; sources of the plurality of the MOS transistors are made common by connecting to each other; and gates of the first pair of the MOS transistors (M1, M3) connected to the input side of the amplifier and gates of the second pair of the MOS transistors (M4, M2) connected to the output side of the amplifier are respectively made common.

In this configuration, a plurality of frequency control signal voltages are applied to the plural pairs of the common gate terminals and drain terminals of the plurality of the MOS transistors to thereby perform the frequency control of the oscillator.

According to an eighth aspect of the present invention, the common sources of the plurality of the MOS transistors may be connected to a grounding terminal via a capacitor (C3) in the configuration of the seventh aspect.

According to a ninth aspect of the present invention, a voltage controlled oscillator has an amplifier, a feedback circuit and a crystal oscillator, the feedback circuit and the crystal oscillator connected in parallel across an input side terminal and an output side terminal of the amplifier. The voltage controlled oscillator comprises a pair of first and second MOS transistors (M1, M2) serving as variable capacitance elements for frequency adjustment. Drains of the first and second MOS transistors are respectively connected to two terminals (XT, XTB) of the crystal oscillator; sources of the first and second MOS transistors are made common by connecting to each other; and gates of the first and second MOS transistors are separated from each other.

In this configuration, a temperature compensating signal voltage and an external frequency control signal voltage are independently applied to the gate terminals of the first and second MOS transistors to thereby perform the frequency control of the oscillator.

According to a tenth aspect of the present invention, the common sources of the first and second MOS transistors may be connected to a grounding terminal via a capacitor (C1) in the configuration of the ninth aspect.

According to an eleventh aspect of the present invention, the common gate terminal side of the plurality of MOS transistors may be connected with a VT correction circuit for generating a VT correction signal voltage for canceling VT variations and temperature characteristics of the plurality of MOS transistors, wherein the VT correction signal voltage is superimposed on the control voltage for the frequency adjustment in any one of the first to tenth aspects.

With such a configuration, the conventional two fixed capacitors can be reduced to one or zero by optimizing the size of the MOS transistor and by connecting the sources thereof. That is, the characteristics equivalent to the conventional example can be exhibited by optimizing the gate capacitance of the MOS transistor. Furthermore, the capacitor conventionally connected to the source can be deleted, and thereby the simplification of the circuit can be realized and miniaturization can be attained. The variations of the MOS transistors can be canceled by using a variation detection circuit and a correction circuit.

According to the present invention, the capacitor conventionally connected to the source can be deleted, and thereby the simplification of the circuit and the miniaturization thereof can be attained.

DESCRIPTION OF THE PREFERRED EMBODIMENTS

Figure 14:
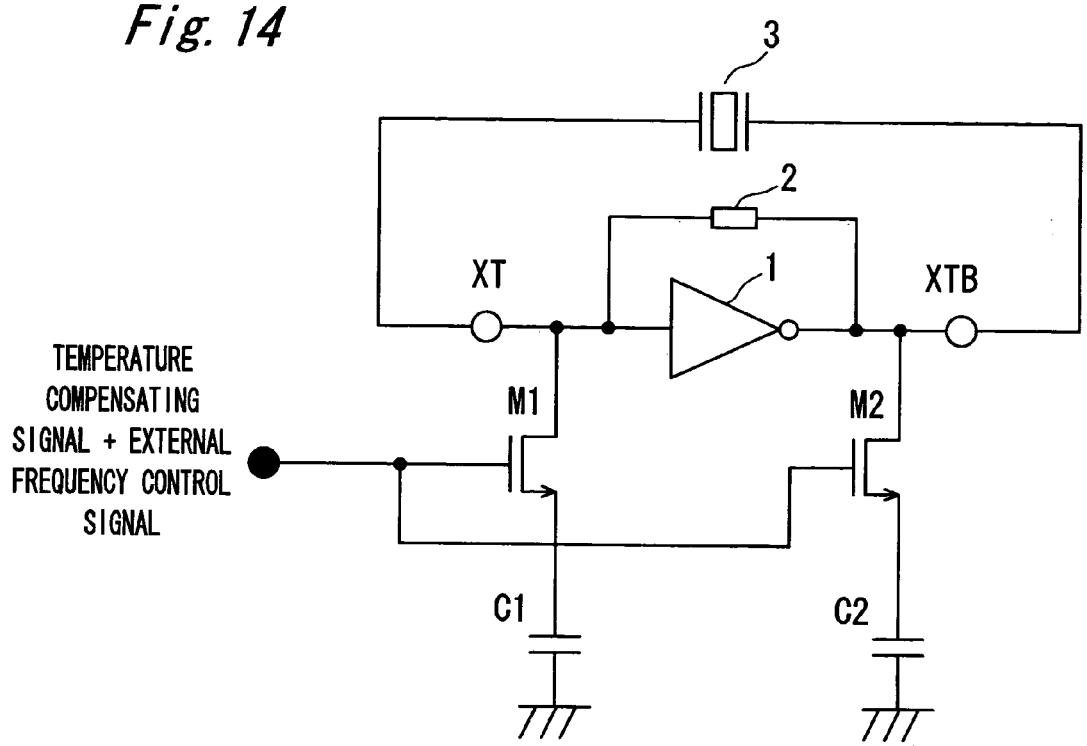
FIG. 14 is a block diagram of a first example of a conventional voltage controlled oscillator.
Figure 15:
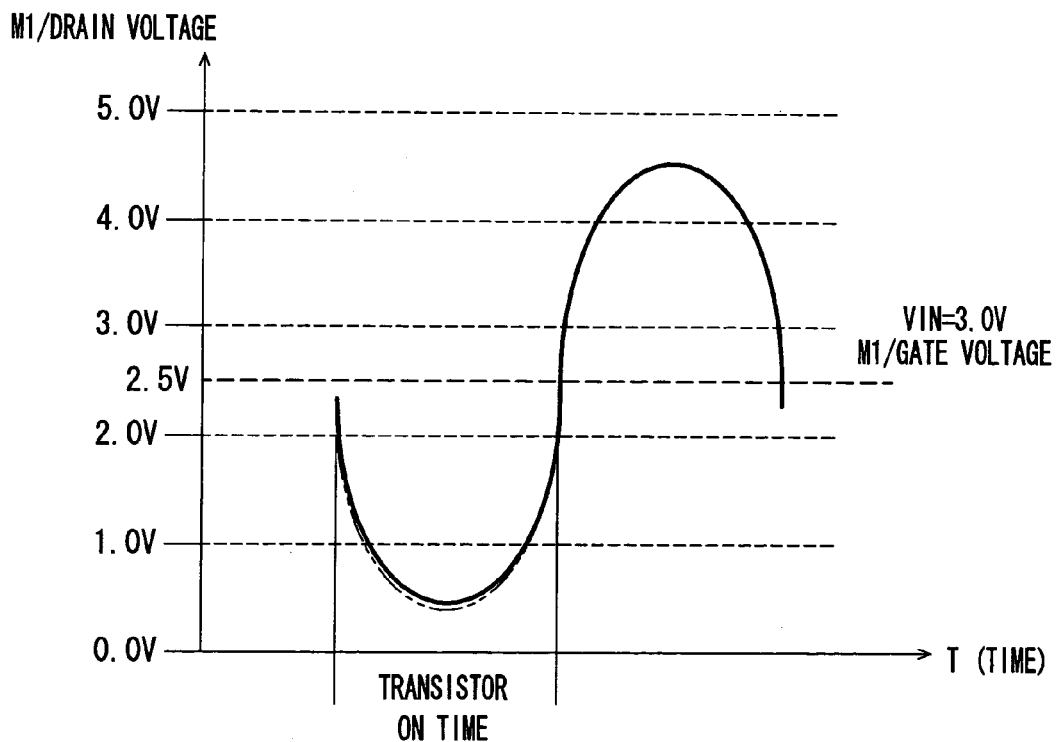
FIG. 15 is an illustration of the operation of a conventional circuit.
Figure 16:
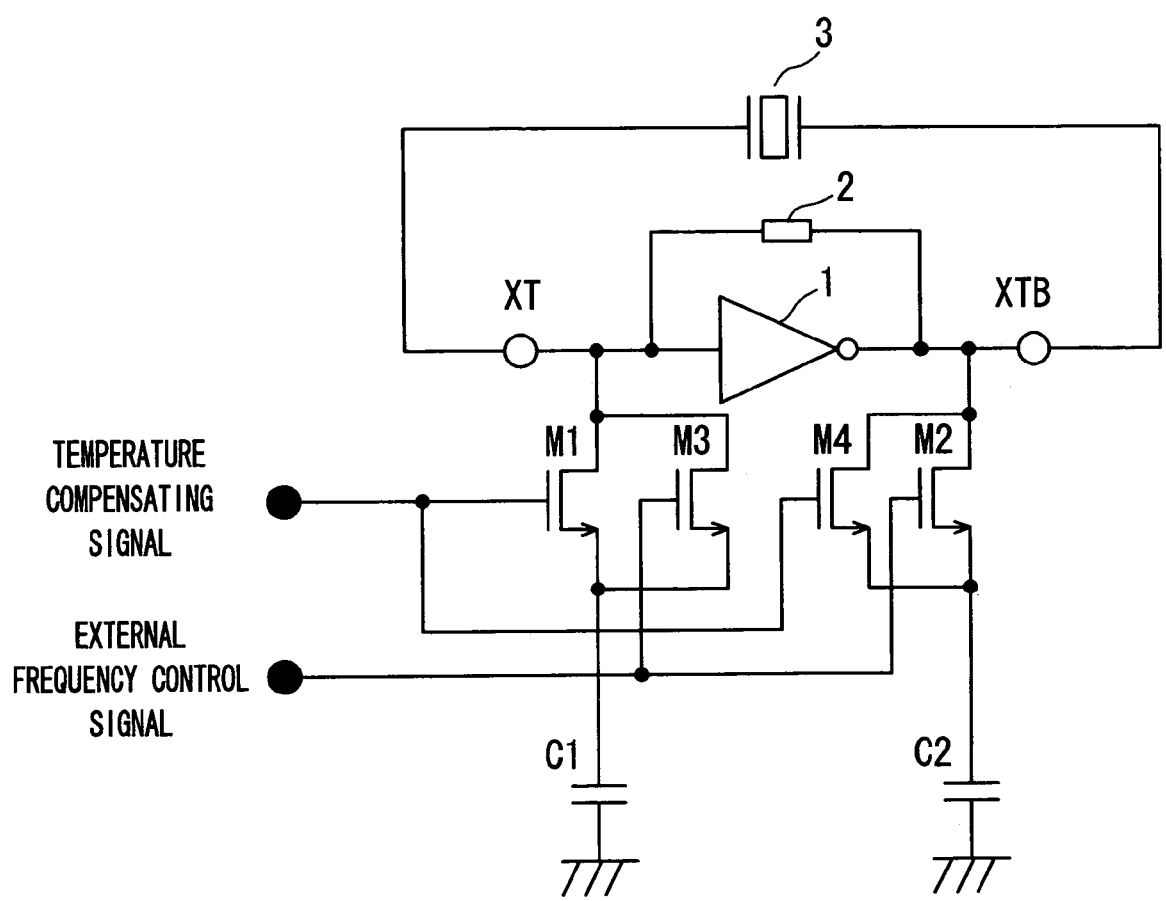
FIG. 16 is a block diagram of a second example of a conventional voltage controlled oscillator.

Now, with reference to the figures, preferred embodiments of the present invention are detailed below. It is to be noted that identical components having similar functions to those in the conventional example shown in FIG. 14 are designated by identical reference numerals, and will not be further elaborated on here.

First Embodiment

Figure 1:
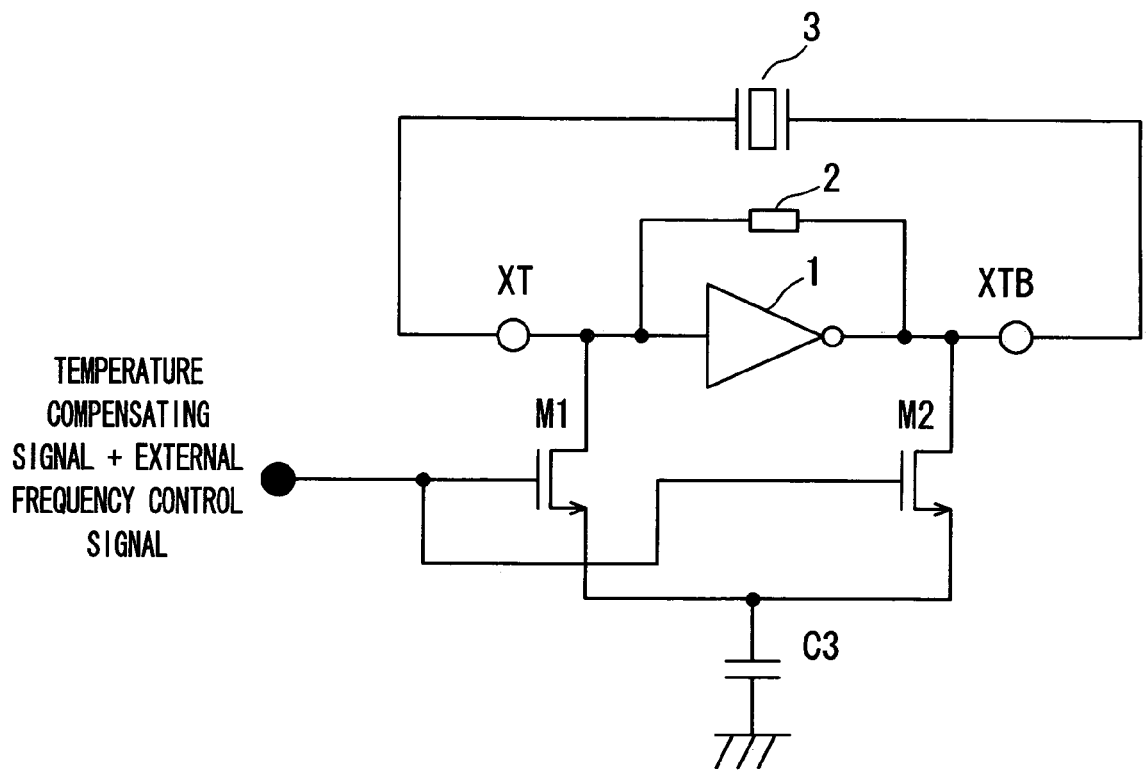
FIG. 1 is a block diagram showing a voltage controlled oscillator according to a first embodiment of the present invention.
Figure 2:
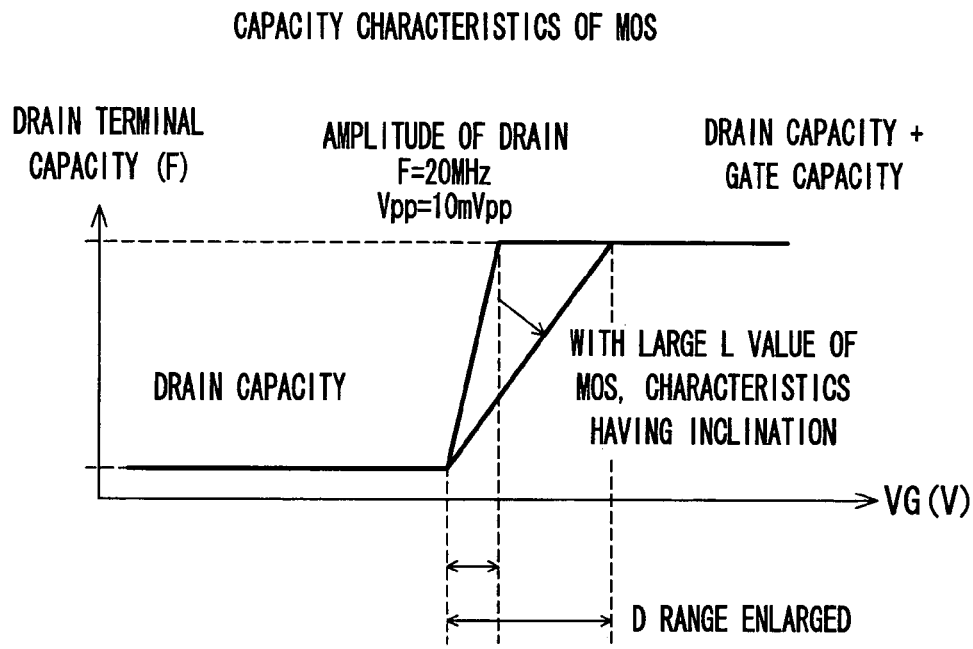
FIG. 2 is a characteristic chart of an MOS transistor according to the first embodiment.

FIG. 1 shows a circuit configuration of a voltage controlled oscillator according to a first embodiment, and FIG. 2 shows a characteristic chart of an MOS transistor according to the first embodiment.

As shown in FIG. 1, in the voltage controlled oscillator including an amplifier 1, a feedback circuit 2 and a crystal oscillator 3, a pair of first and second MOS transistors M1, M2 are connected for use as variable capacitance elements for frequency adjustment of the voltage controlled oscillator. Drains of the MOS transistors M1, M2 are respectively connected to an XT terminal and an XTB terminal to which the crystal oscillator 3 is connected. Sources of the MOS transistors M1, M2 are made common and are connected to a grounding terminal via a capacitor C3. Gates of the MOS transistors M1, M2 are made common, and by adding a temperature compensating voltage signal to an external frequency control voltage signal and by applying the added voltage signal to the common gate terminals, the frequency control is performed.

The waveforms of the drain voltages of the MOS transistors M1, M2 have a large AC amplitude in the same fashion as in the conventional example. In the present embodiment, as shown in FIG. 2, when the drain voltage falls below a gate voltage, a channel is formed, and the characteristics of the MOS transistor are drastically switched in a manner such that only a drain capacitance before the channel is formed is changed to an addition value of drain capacitance+gate capacitance after the channel is formed.

The conventional technique uses the MOS transistor as a switching element to switch the capacitance under the source as a load capacitor. However, the present embodiment realizes the same characteristics by switching the capacitances of the MOS transistors M1, M2 per se. Thereby, the capacitor under the source in the conventional technique is deleted.

When the oscillation amplitude of the drain voltage is small, a narrow D range is also a problem. However, when an L value of the MOS transistor is set a little larger, it requires a time to form the channel completely, and the switching characteristics are not sharp, thereby obtaining a desired D range.

Second Embodiment

Figure 3:
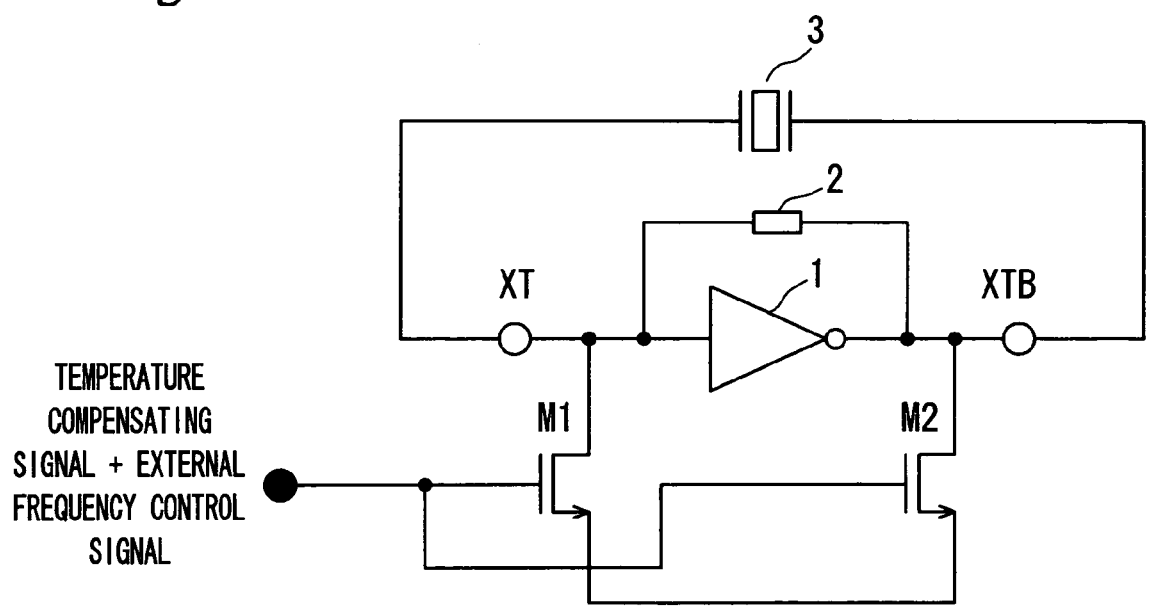
FIG. 3 is a block diagram showing a voltage controlled oscillator according to a second embodiment of the present invention.

FIG. 3 shows a circuit configuration of a voltage controlled oscillator according to a second embodiment. As shown in FIG. 3, in the voltage controlled oscillator including an amplifier 1, feedback circuit 2 and a crystal oscillator 3, two MOS transistors M1, M2 are connected for use as variable capacitance elements for frequency adjustment of the voltage controlled oscillator. Drains of the two MOS transistors M1, M2 are respectively connected to two terminals (XT, XTB) to which the crystal oscillator 3 is connected. Sources of the MOS transistors M1, M2 are made common, and gates of the MOS transistors M1, M2 are also made common. A temperature compensating voltage signal is added to an external frequency control voltage signal, and the frequency control is performed by applying the added voltage in common to the gate terminals of the MOS transistors M1, M2.

According to the second embodiment, the capacitor (C3) under the source in the first embodiment is eliminated. That is, since the capacitor C3 under the source does not contribute to frequency variability so much in the first embodiment, the capacitor under the source can be deleted by optimizing the MOS transistors as in the second embodiment.

Third Embodiment

Figure 4:
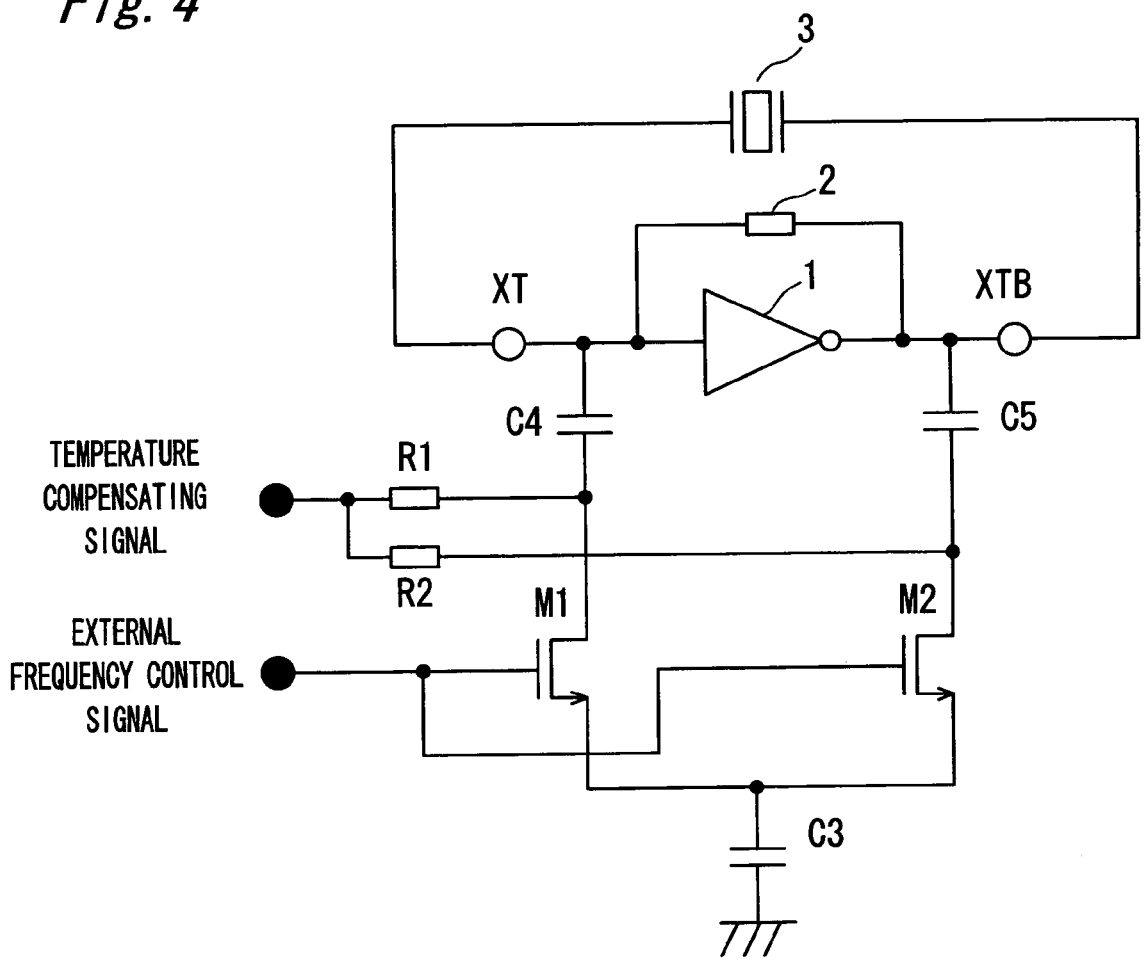
FIG. 4 is a block diagram showing a voltage controlled oscillator according to a third embodiment of the present invention.

FIG. 4 shows a circuit configuration of a voltage controlled oscillator according to a third embodiment. As shown in FIG. 4, in the voltage controlled oscillator including an amplifier 1, a feedback circuit 2 and a crystal oscillator 3, two MOS transistors M1, M2 are connected for use as variable capacitance elements for frequency adjustment of the voltage controlled oscillator. Drains of the two MOS transistors M1, M2 are connected to two terminals (XT, XTB) of the crystal oscillator 3 via capacitors C4 and C5, respectively. Sources of the MOS transistors M1, M2 are made common and are connected to the grounding terminal via a capacitor C3. Thus, the frequency control can be performed by adjusting the voltages of the drains of the MOS transistors M1, M2.

In this configuration, by providing resistances R1, R2 connected to nodes between the drain terminals of the MOS transistors M1, M2 and the capacitors C4, C5, respectively, a temperature compensating voltage signal is applied to the drains of the MOS transistors M1, M2 via the resistances R1, R2 for controlling the frequency while an external frequency control voltage signal is applied to the gates of the MOS transistors M1, M2. Thus, according to the third embodiment, the temperature compensating signal and the external frequency control signal can be separately applied.

Fourth Embodiment

Figure 5:
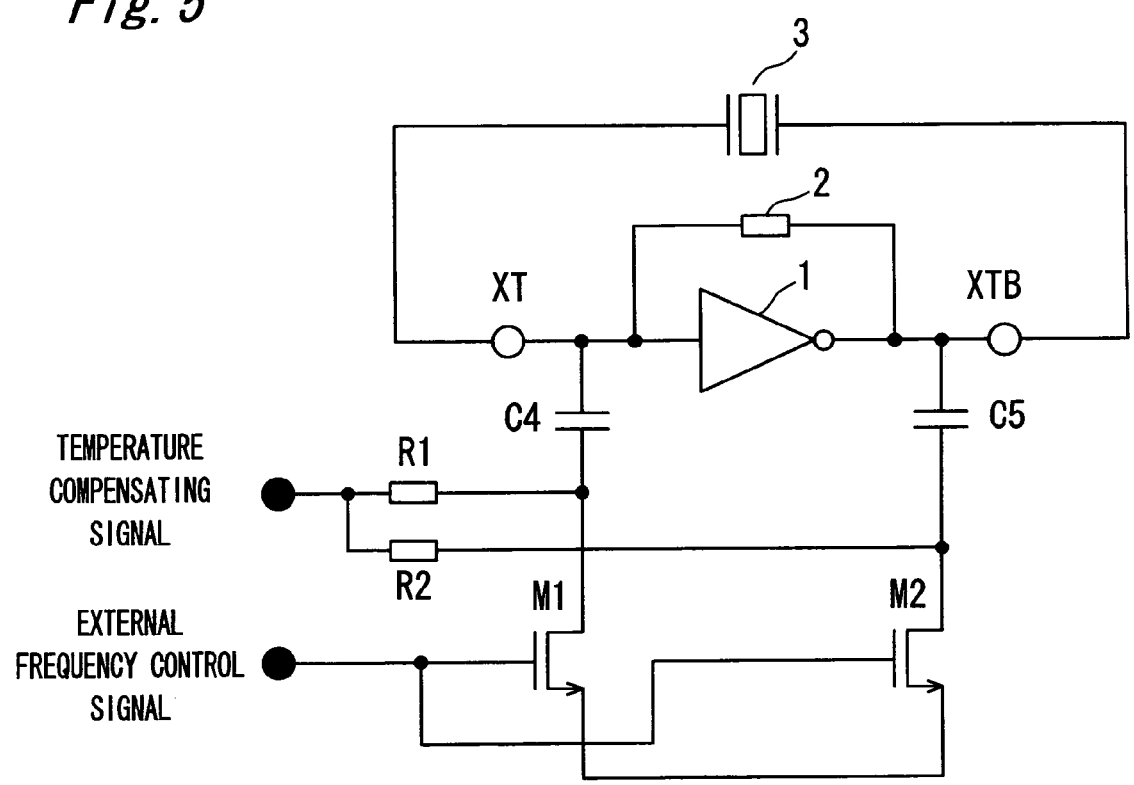
FIG. 5 is a block diagram showing a voltage controlled oscillator according to a fourth embodiment of the present invention.

FIG. 5 shows a circuit configuration of a voltage controlled oscillator according to a fourth embodiment. As shown in FIG. 5, in the voltage controlled oscillator including an amplifier 1, a feedback circuit 2 and a crystal oscillator 3, two MOS transistors M1, M2 are connected for use as variable capacitance elements for frequency adjustment of the voltage controlled oscillator. Drains of the two MOS transistors M1, M2 are connected to two terminals (XT, XTB) of the crystal oscillator 3 via capacitors C4 and C5, respectively. Sources of the MOS transistors M1, M2 are made common. Thus, the frequency control can be performed by adjusting the voltages of the drains of the MOS transistors M1, M2.

In this configuration, by providing resistances R1, R2 connected to the drain terminals of the MOS transistors M1, M2, respectively, a temperature compensating voltage signal is applied to the drains of the MOS transistors M1, M2 via the resistances R1, R2 for controlling the frequency while an external frequency control voltage signal is applied to the gates of the MOS transistors M1, M2.

Thus, according to the fourth embodiment, the temperature compensating signal and the external frequency control signal can be separately applied, and moreover the capacitor (C3) under the source in the third embodiment can be eliminated.

Fifth Embodiment

Figure 6:
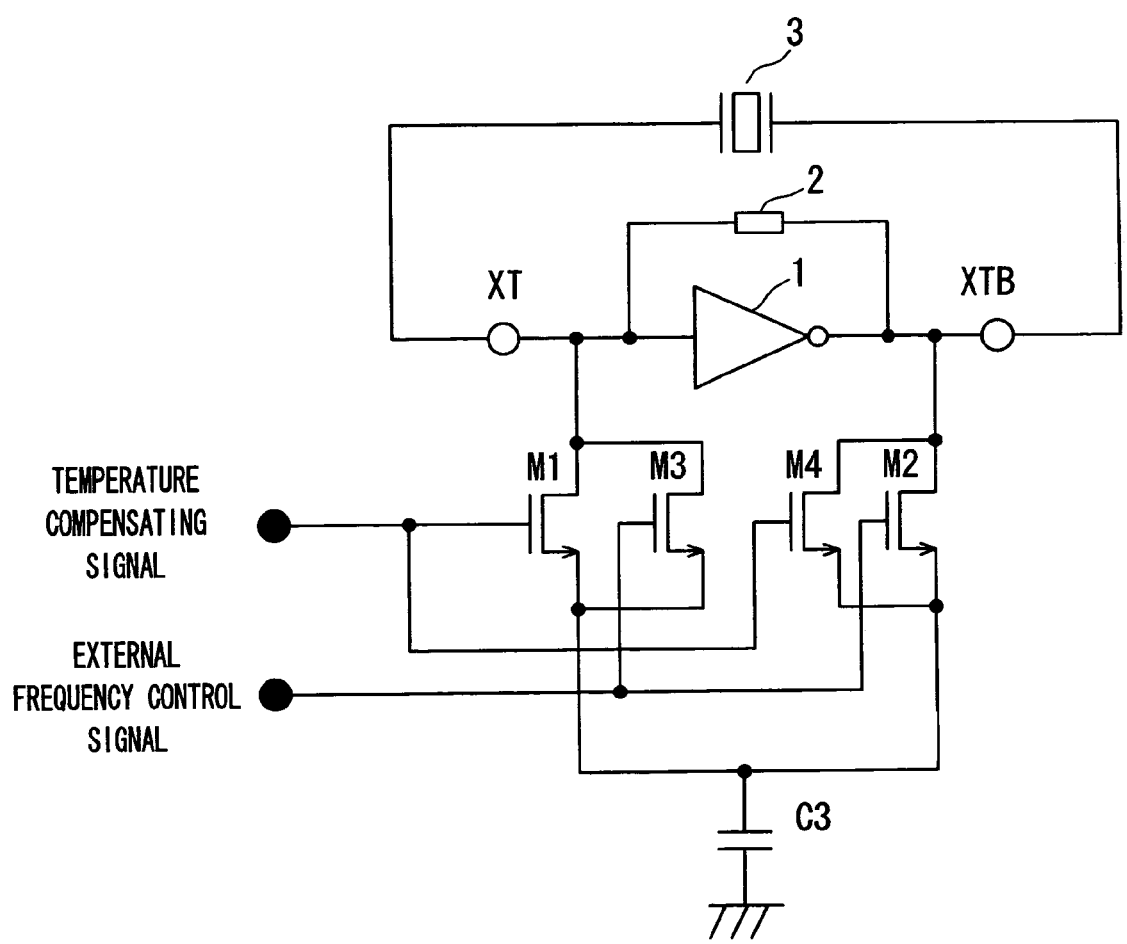
FIG. 6 is a block diagram showing a voltage controlled oscillator according to a fifth embodiment of the present invention.

FIG. 6 shows a circuit configuration of a voltage controlled oscillator according to a fifth embodiment. As shown in FIG. 6, in the voltage controlled oscillator including an amplifier 1, a feedback circuit 2 and a crystal oscillator 3, four MOS transistors M1, M2, M3, M4 are connected for use as variable capacitance elements for frequency adjustment of the voltage controlled oscillator. That is, the drains of the MOS transistors M1, M3 and M4, M2 are respectively made common and connected to two terminals (XT, XTB) to which the crystal oscillator 3 is connected. Sources of the plurality of MOS transistors M1, M2, M3 and M4 are made common and are connected to the grounding terminal via the capacitor C3.

In the gate connection of each MOS transistor, a gate of the MOS transistor M4 connected to the output side of the amplifier 1 and a gate of the MOS transistor M1 connected to the input side of the amplifier 1 are made common, and the common gates thereof are supplied with a temperature compensating control voltage signal. Meanwhile, a gate of the MOS transistor M2 connected to the output side of the amplifier 1 and a gate of the MOS transistor M3 connected to the input side of the amplifier 1 are made common, and the common gates thereof are supplied with an external frequency control voltage signal. Thus, a plurality of control voltage signals can be applied through the gates of the MOS transistors M1, M3, M2 and M4.

According to the fifth embodiment, the MOS transistors M1, M2 in the first embodiment shown in FIG. 1 are respectively divided into two, making the MOS transistors M3, M4 as shown in FIG. 6. The MOS transistors of the input side and output side of the amplifier 1 are respectively connected, and thereby a plurality of control voltage applying terminals are provided. Thus, for example, the temperature compensating control voltage and the external frequency control voltage required for TCXO can be individually applied.

Sixth Embodiment

Figure 7:
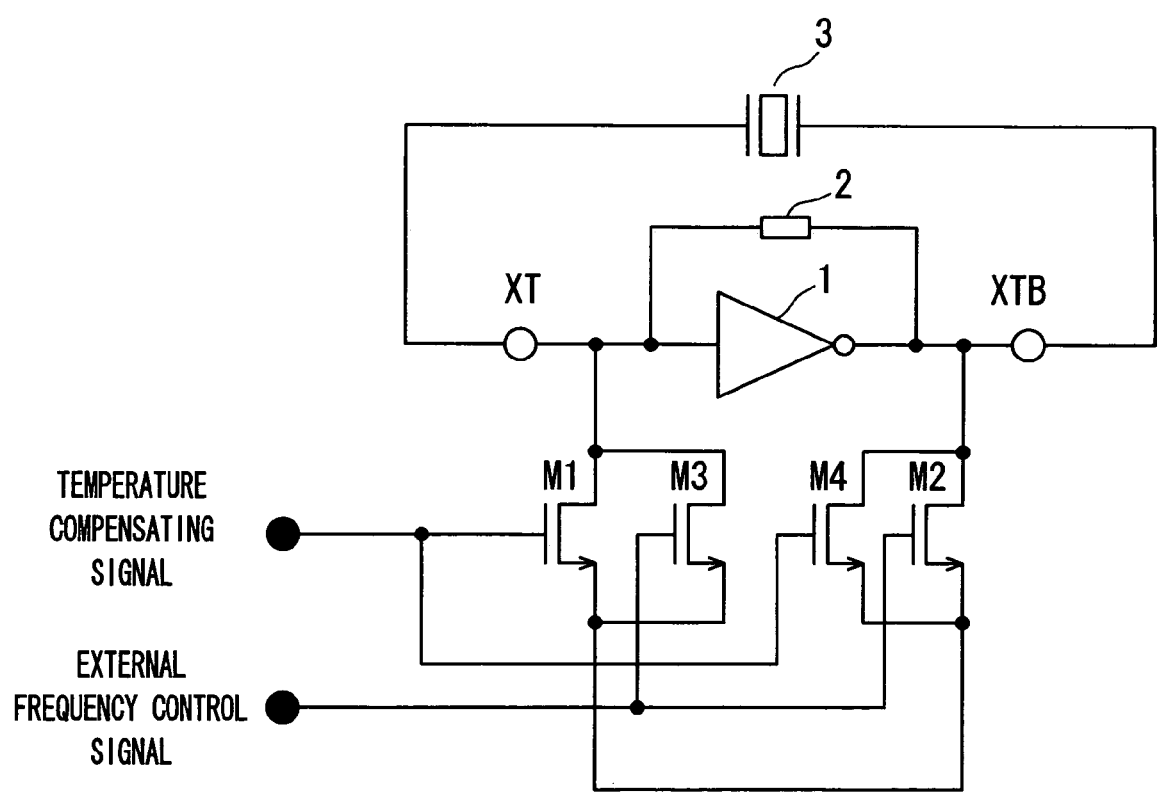
FIG. 7 is a block diagram showing a voltage controlled oscillator according to a sixth embodiment of the present invention.

FIG. 7 shows a circuit configuration of a voltage controlled oscillator according to a sixth embodiment. As shown in FIG. 7, in the voltage controlled oscillator including an amplifier 1, a feedback circuit 2 and a crystal oscillator 3, four MOS transistors M1, M2, M3, M4 are connected for use as variable capacitance elements for frequency adjustment of the voltage controlled oscillator. That is, the drains of the MOS transistors M1, M3 and M4, M2 are respectively made common and connected to two terminals (XT, XTB) to which the crystal oscillator 3 is connected. Sources of the plurality of MOS transistors M1, M2, M3 and M4 are made common.

In the gate connection of each MOS transistor, a gate of the MOS transistor M4 connected to the output side of the amplifier 1 and a gate of the MOS transistor M1 connected to the input side of the amplifier 1 are made common, and the common gates thereof are supplied with a temperature compensating control voltage signal. Meanwhile, a gate of the MOS transistor M2 connected to the output side of the amplifier 1 and a gate of the MOS transistor M3 connected to the input side of the amplifier 1 are made common, and the common gates thereof are supplied with an external frequency control voltage signal. Thus, a plurality of control voltage signals can be applied through the gates of the MOS transistors M1, M4 and M3, M2.

Thus, according to the sixth embodiment, as compared with the fifth embodiment shown in FIG. 6, the capacitor (C3) under the source is eliminated, and thereby a plurality of control voltages can be applied through the gates of the MOS transistors.

Seventh Embodiment

Figure 8:
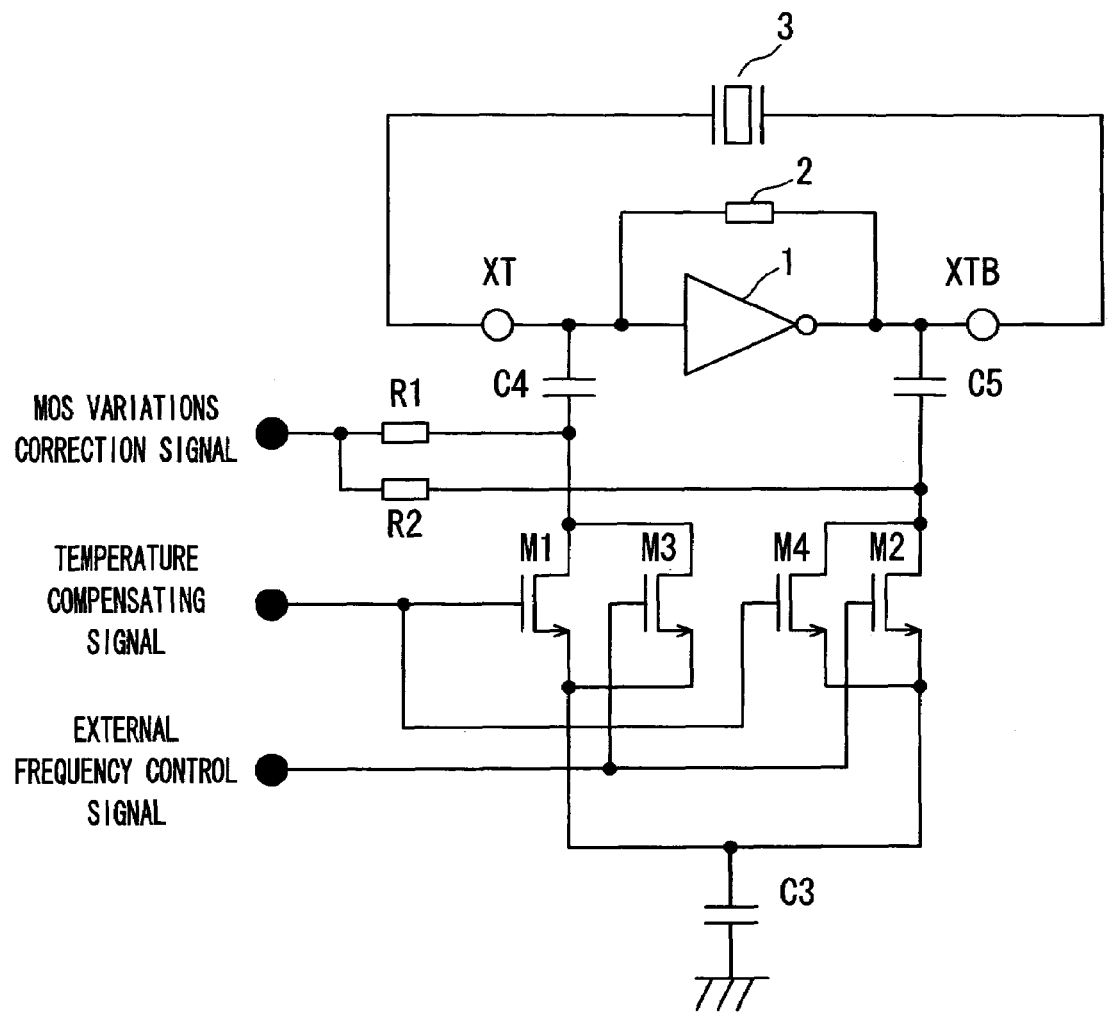
FIG. 8 is a block diagram showing a voltage controlled oscillator according to a seventh embodiment of the present invention.

FIG. 8 shows a circuit configuration of a voltage controlled oscillator according to a seventh embodiment. As shown in FIG. 8, in the voltage controlled oscillator including an amplifier 1, a feedback circuit 2 and a crystal oscillator 3, four MOS transistors M1, M2, M3, M4 are connected for use as variable capacitance elements for frequency adjustment of the voltage controlled oscillator. That is, the drains of the MOS transistors M1, M3 and M4, M2 are respectively made common, and the common drains are connected to two terminals (XT, XTB) for connection of the crystal oscillator 3 via capacitors C4 and C5, respectively. Furthermore, the sources of the plurality of MOS transistors M1, M2, M3, and M4 are made common and are connected to the grounding terminal via the capacitor C3.

In the gate connection of the MOS transistors, a gate of the MOS transistor M4 connected to the output side of the amplifier 1 and a gate of the MOS transistor M1 connected to the input side of the amplifier 1 are made common, and the common gates thereof are supplied with a temperature compensating control voltage signal. Meanwhile, a gate of the MOS transistor M2 connected to the output side of the amplifier 1 and a gate of the MOS transistor M3 connected to the input side of the amplifier 1 are made common, and the common gates thereof are supplied with an external frequency control voltage signal. Thus, a plurality of control voltage signals can be applied through the gates of the MOS transistors M1, M4 and M3, M2.

Furthermore, the control voltages can be also applied from the drains of the MOS transistors. That is, three control terminals of the frequency of the oscillator can be used by inserting fixed capacitors C4, C5 between the crystal oscillator 3 and the drains the MOS transistors M1, M2, respectively, and biasing the drains. Thereby, for example, a temperature compensating control voltage required for TCXO is applied to the gates of the MOS transistors M1, M4, and an external frequency control voltage as VCO is applied to the gates of the MOS transistors M2, M3.

In this configuration, by providing resistances R1, R2 connected to nodes between the common drain terminals of the MOS transistors M1 (M3), M2 (M4) and the capacitors C4, C5, respectively, a MOS variation correcting voltage can be applied to the drains of the MOS transistors M1 (M3), M2 (M4) via the resistances R1, R2. Thus, the MOS variation correcting voltage, temperature compensating control voltage and external frequency control voltage can be individually applied to the MOS transistors.

Eighth Embodiment

Figure 9:
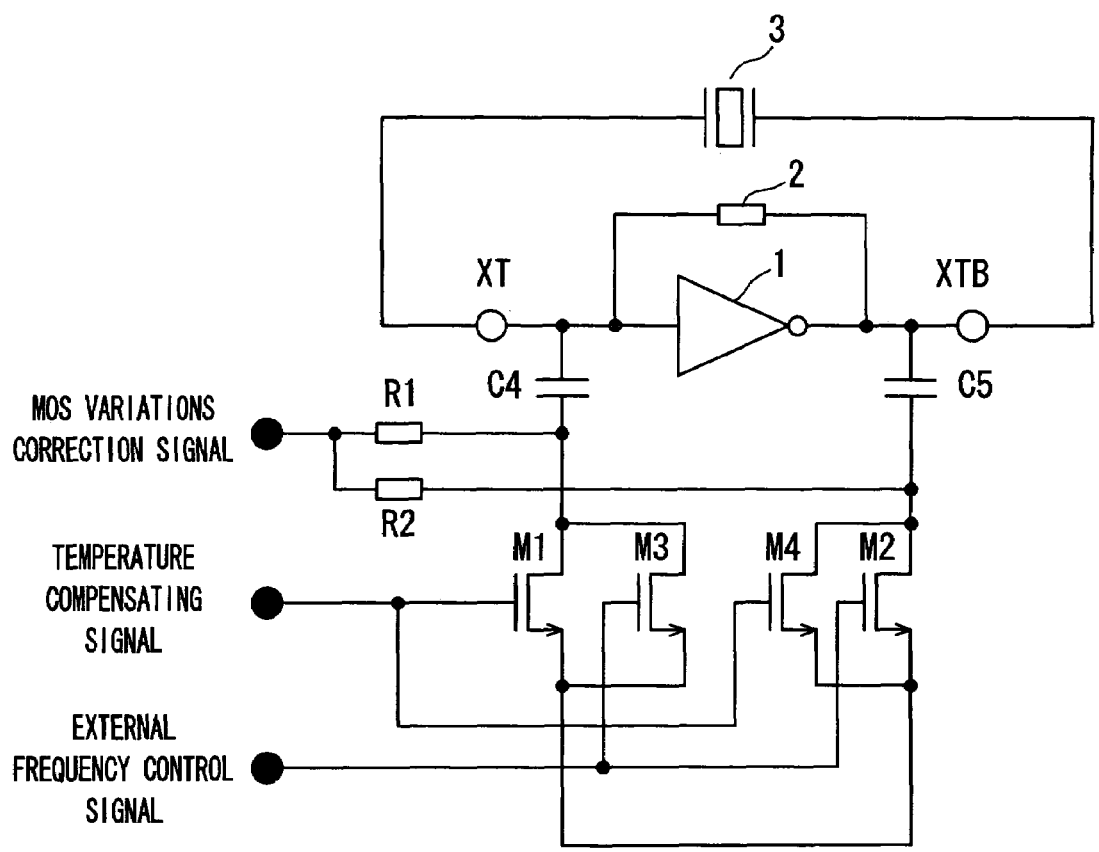
FIG. 9 is a block diagram showing a voltage controlled oscillator according to an eighth embodiment of the present invention.

FIG. 9 shows a circuit configuration of a voltage controlled oscillator according to an eighth embodiment. As shown in FIG. 9, in the voltage controlled oscillator including an amplifier 1, a feedback circuit 2 and a crystal oscillator 3, four MOS transistors M1, M2, M3, M4 are connected for use as variable capacitance elements for frequency adjustment of the voltage controlled oscillator. That is, the drains of the MOS transistors M1, M3 and M4, M2 are respectively made common, and the common drains are connected to two terminals (XT, XTB) for connection of the crystal oscillator 3 via capacitors C4 and C5, respectively. Furthermore, the sources of the plurality of MOS transistors M1, M2, M3, and M4 are made common.

In the gate connection of the MOS transistors, a gate of the MOS transistor M4 connected to the output side of the amplifier 1 and a gate of the MOS transistor M1 connected to the input side of the amplifier 1 are made common, and the common gates thereof are supplied with a temperature compensating control voltage signal. Meanwhile, a gate of the MOS transistor M2 connected to the output side of the amplifier 1 and a gate of the MOS transistor M3 connected to the input side of the amplifier 1 are made common, and the common gates thereof are supplied with an external frequency control voltage signal. Thus, a plurality of control voltage signals can be applied through the gates of the MOS transistors M1 (M4) and M2 (M3).

According to the eighth embodiment, as compared with the seventh embodiment shown in FIG. 8, the capacitor (C3) under the sources of the MOS transistors is eliminated, and a plurality of control voltage signals can be applied through the gates of the MOS transistors. Furthermore, the control voltages can be also applied through the drains of the MOS transistors.

Ninth Embodiment

Figure 10:
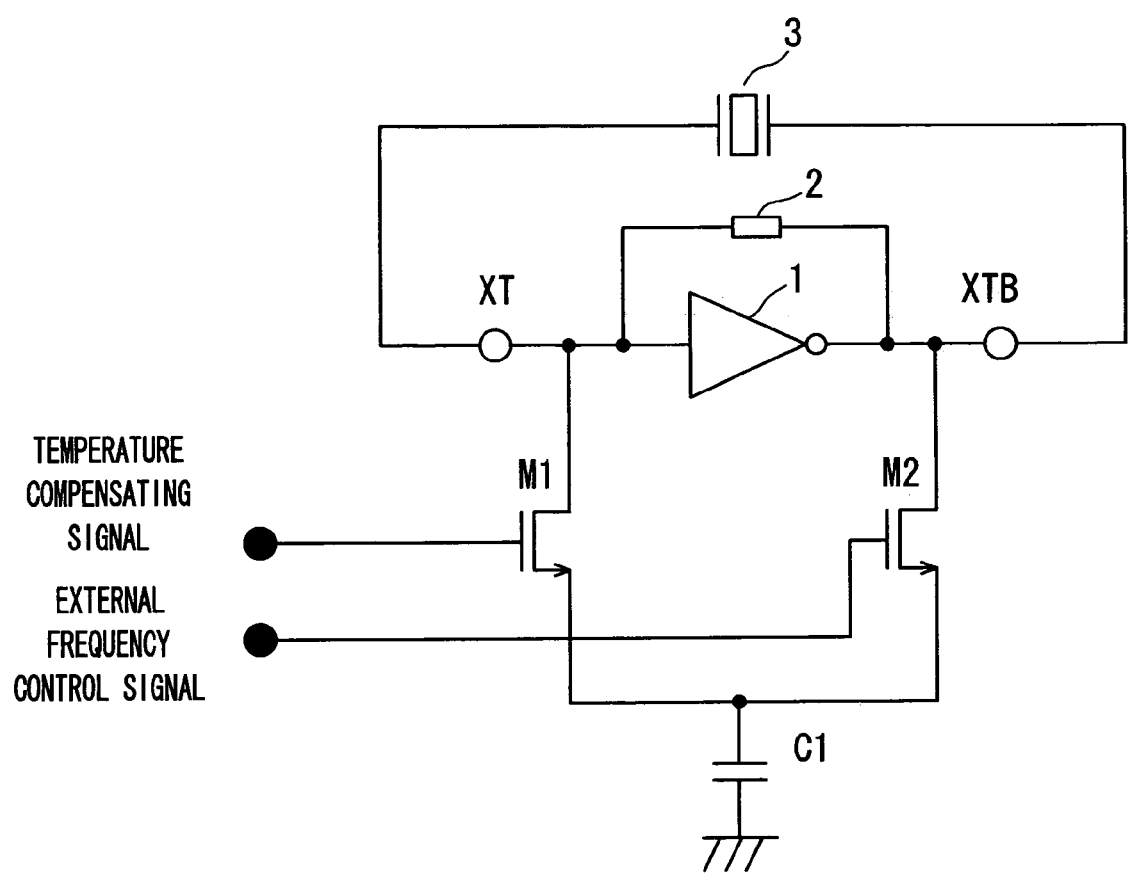
FIG. 10 is a block diagram showing a voltage controlled oscillator according to a ninth embodiment of the present invention.

FIG. 10 shows a circuit configuration of a voltage controlled oscillator according to a ninth embodiment. As shown in FIG. 10, in the voltage controlled oscillator including an amplifier 1, a feedback circuit 2 and a crystal oscillator 3, two MOS transistors M1, M2 are connected for use as variable capacitance elements for frequency adjustment of the voltage controlled oscillator. Drains of the MOS transistors M1, M2 are respectively connected to an XT terminal and an XTB terminal for connection of the crystal oscillator 3. Sources of the MOS transistors M1, M2 are made common and are connected to a grounding terminal via a capacitor C1. By independently applying a temperature compensating voltage signal to the gate terminal of the MOS transistor M1 while applying an external frequency control voltage signal to the gate terminal of the MOS transistor M2, the frequency control is performed.

Thus, the control voltage applying terminal is divided into two so that two types of the control voltages can be respectively applied to the gates of the MOS transistors M1, M2. Accordingly, the temperature compensating voltage and the external frequency control voltage as VOC can be individually applied.

Tenth Embodiment

Figure 11:
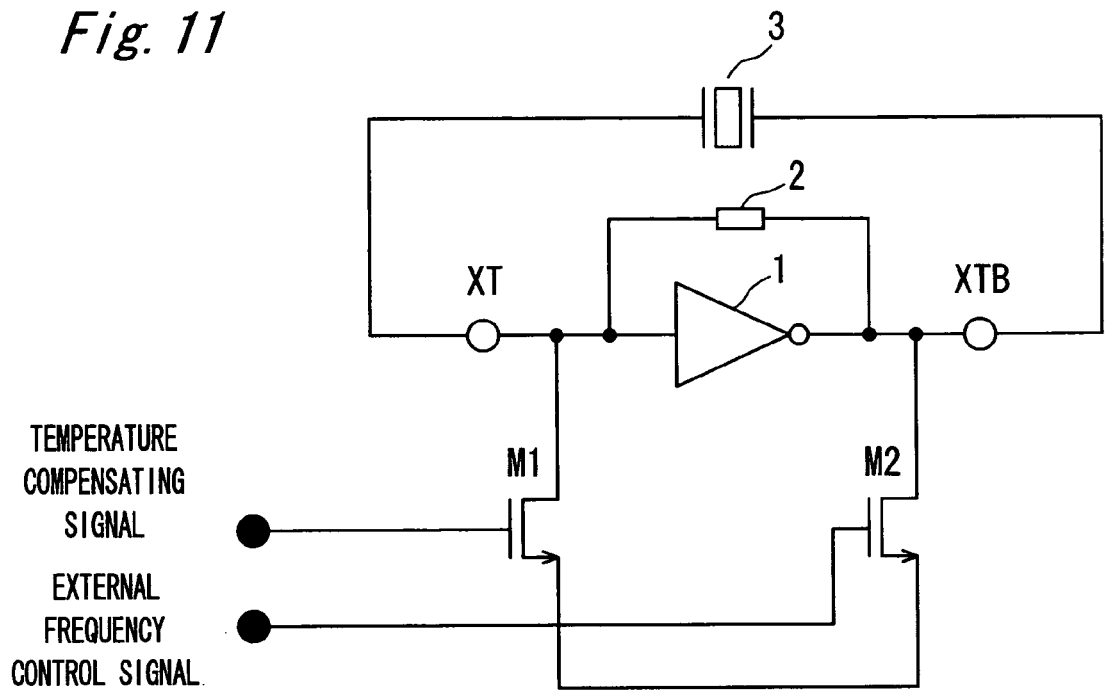
FIG. 11 is a block diagram showing a voltage controlled oscillator according to a tenth embodiment of the present invention.

FIG. 11 shows a circuit configuration of a voltage controlled oscillator according to a ninth embodiment. As shown in FIG. 10, in the voltage controlled oscillator including an amplifier 1, a feedback circuit 2 and a crystal oscillator 3, two MOS transistors M1, M2 are connected for use as variable capacitance elements for frequency adjustment of the voltage controlled oscillator. Drains of the MOS transistors M1, M2 are respectively connected to an XT terminal and an XTB terminal for connection of the crystal oscillator 3. Sources of the MOS transistors M1, M2 are made common. By independently applying a temperature compensating voltage signal to the gate terminal of the MOS transistor M1 while applying an external frequency control voltage signal to the gate terminal of the MOS transistor M2, the frequency control is performed.

Thus, the tenth embodiment eliminates the capacitor (C1) under the source in the ninth embodiment, and the control voltage applying terminal is divided into two so that two types of the control voltages can be respectively applied to the gates of the MOS transistors M1, M2. Accordingly, the temperature compensating voltage and the external frequency control voltage can be individually applied.

Eleventh Embodiment

Figure 12:
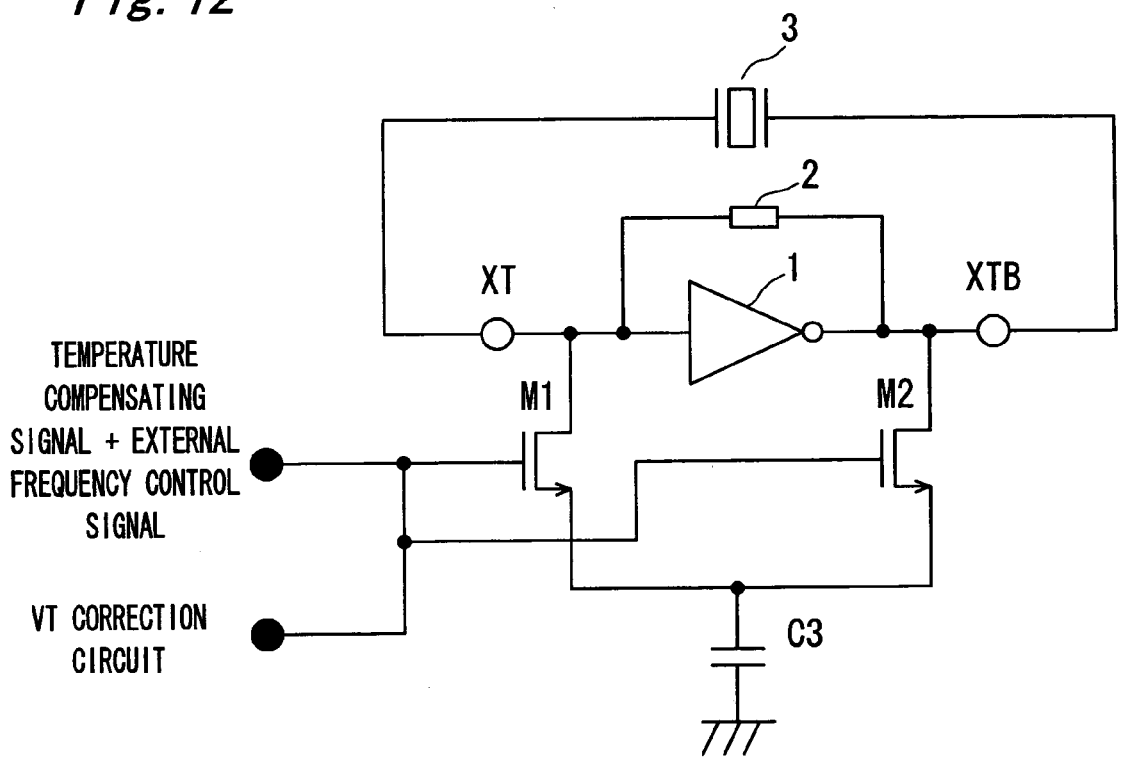
FIG. 12 is a block diagram showing a voltage controlled oscillator according to an eleventh embodiment of the present invention.

FIG. 12 shows a circuit configuration of a voltage controlled oscillator according to an eleventh embodiment. As shown in FIG. 12, in the voltage controlled oscillator including an amplifier 1, a feedback circuit 2 and a crystal oscillator 3, two MOS transistors M1, M2 are connected for use as variable capacitance elements for frequency adjustment of the voltage controlled oscillator. Drains of the MOS transistors M1, M2 are respectively connected to an XT terminal and an XTB terminal for connection of the crystal oscillator 3. Sources of the MOS transistors M1, M2 are made common and are connected to a grounding terminal via a capacitor C3. Gates of the MOS transistors M1, M2 are made common, and the common gate terminal is supplied with an added voltage signal of a temperature compensating voltage signal and an external frequency control voltage signal. Furthermore, the common gate terminal is supplied with a signal voltage from a VT correction circuit so that the VT correction signal voltage is superimposed on the added control voltage of the temperature compensating voltage and the external frequency control voltage, and thus the frequency control is performed.

According to the eleventh embodiment, in the voltage controlled oscillator including the amplifier 1, the feedback circuit 2 and the crystal oscillator 3, the VT correction circuit is connected to the common gate terminal of the MOS transistors M1, M2, so that the VT correction signal voltage is generated as a cancel signal for canceling VT variations and temperature characteristics of the MOS transistors M1, M2. The cancel signal is superimposed on the added control voltage. Thereby, the VT variations of the MOS transistors M1, M2 of the variable capacitance elements can be suppressed as compared to the oscillator of the first embodiment.

Figure 13:
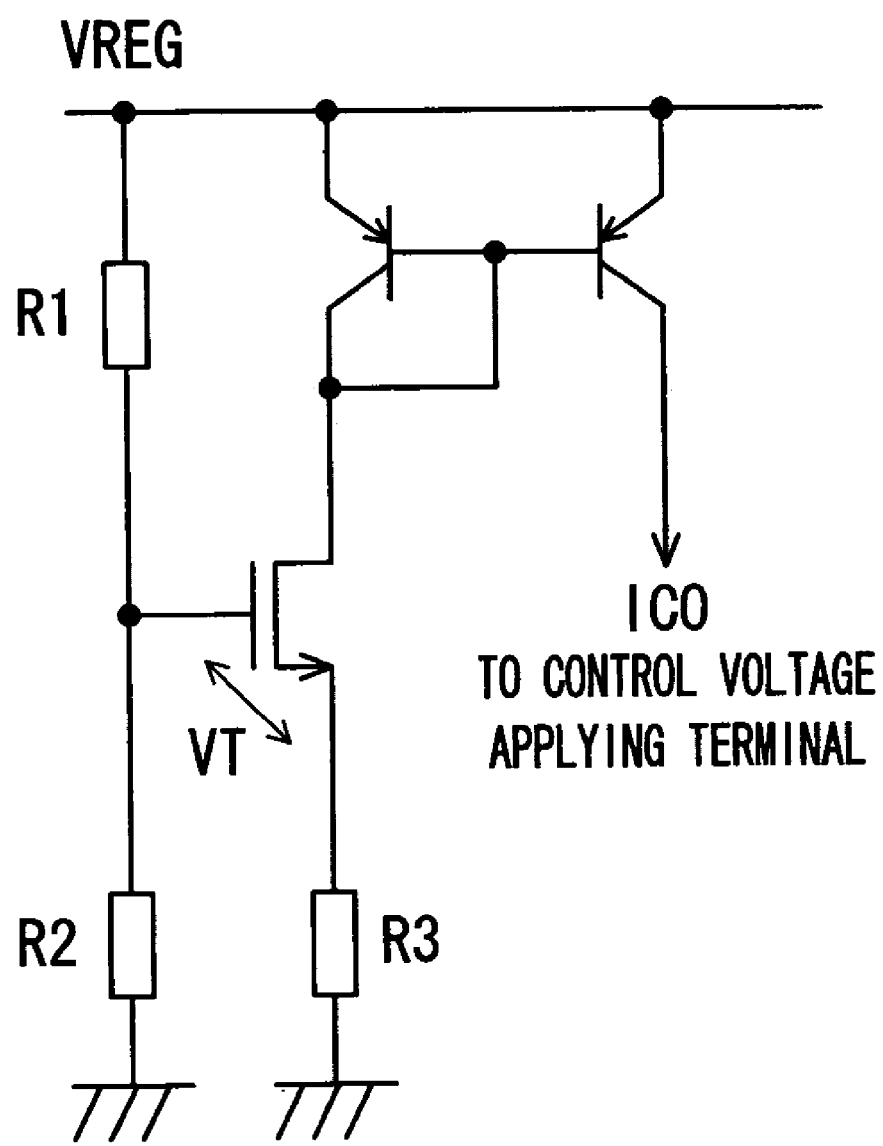
FIG. 13 is a circuit diagram showing an example of a VT correction circuit according to the eleventh embodiment.

FIG. 13 is a circuit diagram showing a configuration example of the VT correction circuit. For example, a current ICO proportional to VT shown in FIG. 13 is designed, and the ICO current is synthesized to the control voltage and the resultant voltage signal is applied to the MOS transistors M1, M2. The ICO current is calculated by an equation as below:

$$IOC = \frac{VREG \times \frac{R2}{R1+R2} - VT}{R3} \qquad 5$$

It is noted here that such a VT correction circuit can be also connected to the configurations of the second to tenth embodiments shown in FIGS. 3 to 11 as well as the configuration of the first embodiment.

As described above, the present invention provides a useful voltage controlled oscillator having a smaller and simplified configuration.

What is claimed is:

1. A voltage controlled oscillator having an amplifier, a feedback circuit and a crystal oscillator, said feedback circuit and said crystal oscillator connected in parallel across an input side terminal and an output side terminal of the amplifier, said voltage controlled oscillator comprising:

a pair of first and second MOS transistors serving as variable capacitance elements for frequency adjustment;

drains of the first and second MOS transistors being respectively connected to two terminals of the crystal oscillator;

sources of the first and second MOS transistors being made common by directly connecting to each other; and gates of the first and second MOS transistors being made common by connecting to each other, wherein an added voltage signal of a temperature compensating signal voltage and an external frequency control signal voltage is applied to the common gate terminals of the first and second MOS transistors to thereby perform the frequency control of the oscillator.

2. The voltage controlled oscillator according to claim 1, wherein the common sources of the first and second MOS transistors are connected to a grounding terminal via a capacitor.

* * * * *